(12) United States Patent
Lin et al.

(10) Patent No.: US 12,389,570 B2
(45) Date of Patent: Aug. 12, 2025

(54) ELECTRONIC DEVICE

(71) Applicant: InnoLux Corporation, Miao-Li County (TW)

(72) Inventors: Tzu-Yuan Lin, Miao-Li County (TW); Tsau-Hua Hsieh, Miao-Li County (TW); Jian-Jung Shih, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 313 days.

(21) Appl. No.: 18/134,584

(22) Filed: Apr. 14, 2023

(65) Prior Publication Data
US 2023/0371205 A1    Nov. 16, 2023

(30) Foreign Application Priority Data

May 16, 2022    (CN) .......................... 202210533746.3

(51) Int. Cl.
*H05K 7/20* (2006.01)
*H05K 5/02* (2006.01)
*H05K 5/30* (2025.01)

(52) U.S. Cl.
CPC ......... *H05K 7/2039* (2013.01); *H05K 5/0221* (2013.01); *H05K 5/30* (2025.01); *H05K 7/20963* (2013.01)

(58) Field of Classification Search
CPC ............. H05K 7/2039; H05K 7/20963; H05K 5/0221; H05K 5/30
USPC ........................................................ 361/707
See application file for complete search history.

(56) References Cited

U.S. PATENT DOCUMENTS

| | | | |
|---|---|---|---|
| 7,053,314 B1* | 5/2006 | Camerlo | H05K 1/141 174/262 |
| 2008/0222885 A1* | 9/2008 | Kanda | H05K 1/142 29/842 |
| 2010/0020248 A1* | 1/2010 | Choi | H04N 5/64 361/752 |
| 2012/0193797 A1* | 8/2012 | Zhu | H01L 23/481 257/769 |
| 2012/0212920 A1* | 8/2012 | Schreffler | H01R 12/737 29/830 |
| 2017/0140679 A1 | 5/2017 | Tomoda | |
| 2020/0271971 A1 | 8/2020 | Su | |
| 2021/0298210 A1 | 9/2021 | Huang | |

* cited by examiner

*Primary Examiner* — Zhengfu J Feng
(74) *Attorney, Agent, or Firm* — Winston Hsu

(57) ABSTRACT

The present disclosure discloses an electronic device which includes an electronic panel and a supporting plate. The electronic panel includes a substrate, an electronic component disposed on the first surface of the substrate, and a circuit board disposed on the second surface of the substrate. The first surface is opposite to the second surface, and the electronic component and the circuit board are electrically connected to each other. The supporting plate is arranged under the electronic panel and includes an opening through which the circuit board passes. The difference of the thermal expansion coefficient between the substrate and the supporting plate is less than or equal to 4 ppm/° K.

20 Claims, 10 Drawing Sheets

ELECTRONIC DEVICE

BACKGROUND OF THE DISCLOSURE

1. Field of the Disclosure

The present disclosure relates to an electronic device, in particular is directed to an electronic device with both an electronic panel and a supporting plate.

2. Description of the Prior Art

With the development of technology and demand for use, the application of light-emitting diode (LED) devices are becoming popular in life, such as the use of a tiled electronic device which is formed of lamp boards of sub-mm light-emitting diodes (mini LED) or of micro light-emitting diodes (micro LED). Currently, glass mostly serves as the substrate of the sub-millimeter light-emitting diode lamp boards. In order to meet the requirements of transportation and of the strength for tiling, an aluminum plate is attached to the back side of the glass substrate. However, because the coefficient of thermal expansion (CTE) of the aluminum plate differs greatly from that of the glass, it may cause damage to the lamp board so how to improve the quality of the electronic device and to reduce the possibility of causing damage to the lamp board have become an important issue.

SUMMARY OF THE DISCLOSURE

Some embodiments of the present disclosure propose an electronic device, and the electronic device includes an electronic panel and a supporting plate. The electronic panel includes a substrate, an electronic component disposed on the first surface of the substrate, and a circuit board disposed on the second surface of the substrate. The first surface is opposite to the second surface, and the electronic component and the circuit board are electrically connected to each other. The supporting plate is arranged under the electronic panel and includes an opening through which the circuit board passes. The difference of the thermal expansion coefficient between the substrate and the supporting plate is less than or equal to 4 ppm/° K.

According to the electronic device of the embodiments of the present disclosure, reducing the difference between the thermal expansion coefficient of the substrate and of the supporting plate helps improve the quality of the electronic device. In this way, it is advantageous to reduce the possibility of damage to the lamp board to facilitate the technological progress and innovation of the tiled electronic device.

These and other objectives of the present disclosure will no doubt become obvious to those of ordinary skill in the art after reading the following detailed description of the embodiment that is illustrated in the various figures and drawings.

DETAILED DESCRIPTION

Figure 1:
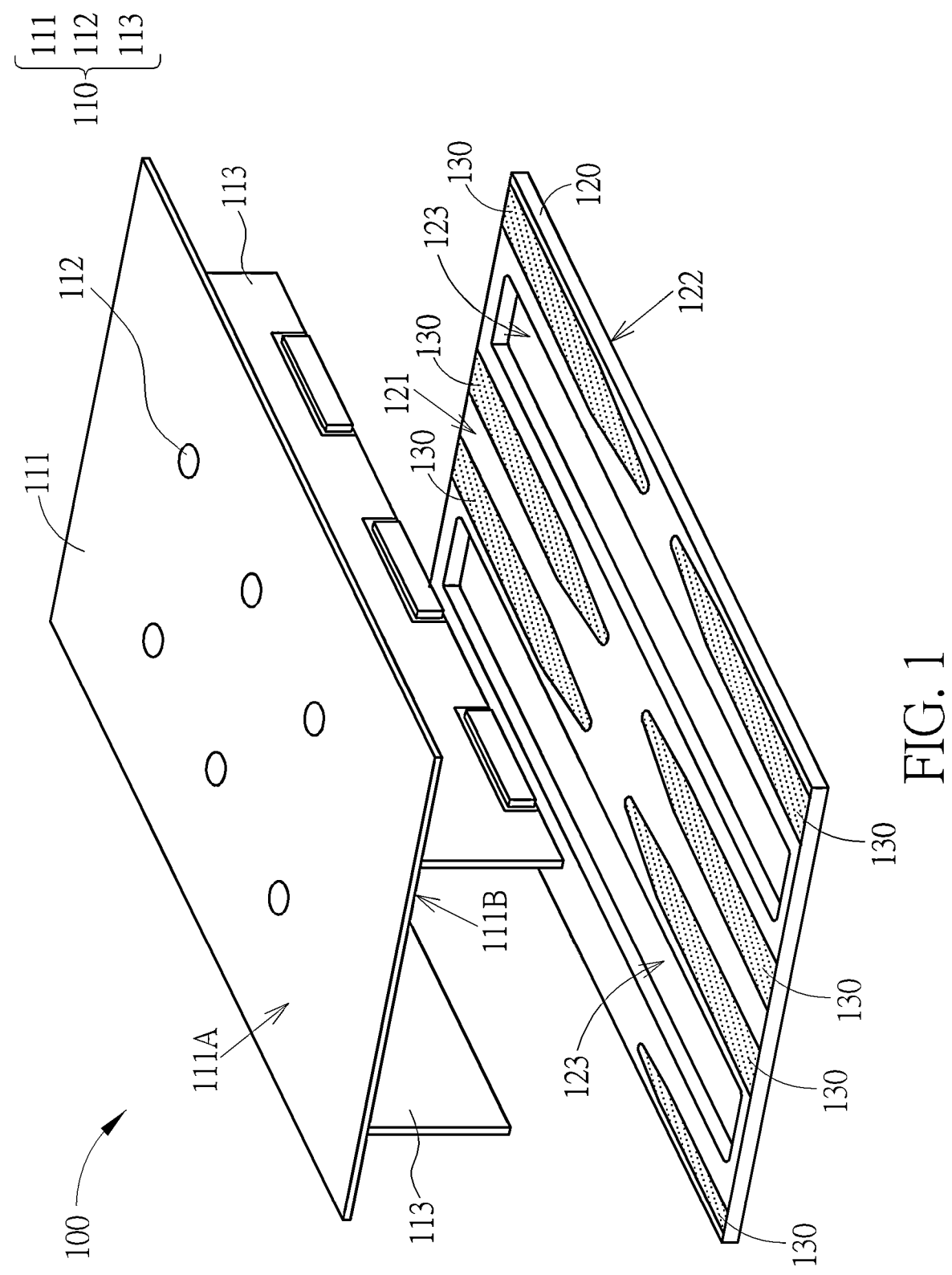
FIG. 1 illustrates an exploded schematic view of an electronic device of an embodiment of the present disclosure.

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not in function.

In the following description and in the claims, the terms "include", "comprise" and "have" are used in an open-ended fashion, and thus should be interpreted to mean "include, but not limited to . . . ".

It will be understood that when an element or a film/layer is referred to as being "on another component or on another layer" or "connected to another component or to another film/layer", it can be directly on or directly connected to the other element or film/layer, or intervening elements or layers may be presented. In contrast, when an element is referred to as being "directly on" or "directly connected to" another element or film/layer, there are no intervening elements or layers presented. When an element is referred to as being "electrically connected to" another element or film/layer, it may be "directly electrically connected to" or "indirectly electrically connected to".

It should be understood that elements or devices in the drawings may exist in various forms which are well known to those skilled in the art. The relative terms mentioned in this article, such as "below", "lower", "bottom", "on", "higher", "top", etc., only refer to the directions of the drawings. It is understandable that the elements described on the "lower" side will become elements on the "higher" side if the device in the drawing is turned upside down. The embodiments of the present disclosure may be understood together with the drawings, and the drawings of the present disclosure are also regarded as a part of the disclosure description. It should be understood that the drawings of the present disclosure are not drawn to scale and, in fact, the dimensions of elements may be arbitrarily enlarged or reduced in order to clearly show the features of the present disclosure. Furthermore, when it is mentioned that a first material layer is located on or over a second material layer, it includes the situations that the first material layer is in direct contact with the second material layer, or there may be one or more other material layers interposed therebetween. Meanwhile, there may be no direct contact between the first material layer and the second material layer.

The terms "about", "equal", or "same", "substantially", "generally" mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The electrical connection or coupling described in this disclosure may refer to direct connection or indirect connection. In the case of a direct connection, the terminals of the components on the two circuits are directly connected or connected to each other by a conductor line segment, and in the case of an indirect connection, there are switches, diodes, capacitors, inductors, resistors, and other suitable devices between the terminals of the components on the two circuits, but the present disclosure is not limited thereto.

In this disclosure, the thickness, length, and width can be measured by using an optical microscope, and the thickness can be measured by a cross-sectional image in an electron microscope, but it is not limited to this. In addition, there may be a certain error in any two values or directions used for comparison. If the first value is equal to the second value, it implies that there may be an error of about 10% between the first value and the second value. In addition, the terms "equal to", "equal", "same", "substantially" or "generally" mentioned in the present disclosure generally mean falling within 10% of a given value or range. In addition, the terms "the given range is from the first numerical value to the second numerical value" and "the given range falls within the range from the first numerical value to the second numerical value" mean that the given range includes the first numerical value, the second numerical value and other values in between. If the first direction is perpendicular to the second direction, the angle difference between the first direction and the second direction may be between 80 degrees and 100 degrees; if the first direction is parallel to the second direction, the angle between the first direction and the second direction may be between 0 degrees and 10 degrees.

Unless otherwise defined, all terms (including technical and scientific terms) used herein have the same meaning as commonly understood by one of ordinary skill in the art to which this disclosure pertains. It should be understood that these terms, such as those defined in commonly used dictionaries, should be interpreted as having meanings consistent with the relevant art and the background or context of the present disclosure, and should not be interpreted in an idealized way or overly formal manner unless they are otherwise defined in the embodiments of the present disclosure.

It should be noted that the technical proposals provided in different embodiments below may be replaced, combined or mixed with each other to form another embodiment without violating the spirit of the present disclosure.

FIG. 1 illustrates an exploded schematic view of an electronic device 100 of an embodiment of the present disclosure. The electronic device 100 of some embodiments of the present disclosure may include an electronic panel 110, a supporting plate 120, and an adhesive material 130. In the present disclosure, the electronic device 100 may include a display device, a backlight device, an antenna device, a sensing device or a tiled device, but the present disclosure is not limited thereto. The electronic device 100 may be a bendable or flexible electronic device. The display device may be a non-self-illuminating display device or a self-illuminating display device. The antenna device may be a liquid crystal type antenna device or a non-liquid crystal type antenna device, and the sensing device may be a sensing device which senses capacitance, light, heat, or ultrasound waves, but the present disclosure is not limited thereto. The tiled device may be, for example, a display tiled device or an antenna tiled device, but the present disclosure is not limited thereto. It should be noted that the electronic device may be any combination of the above, but the present disclosure is not limited thereto. The following uses the display device as the electronic device or the tiled device to elaborate the present disclosure, but the present disclosure is not limited thereto.

The electronic panel 110 may be a display device, for example, may include a substrate 111, an electronic component 112 and a circuit board 113. The substrate 111 may include a first surface 111A and a second surface 111B, the first surface 111A may be arranged relative to the second surface 111B, that is, the first surface 111A and the second surface 111B are respectively located on opposite sides of the substrate 111, for example the first surface 111A may be one of the front side and the back side of the substrate 111, and the second surface 111B may be the other of the front side and the back side of the substrate 111. In some embodiments, the electronic component 112 may be disposed on the first surface 111A of the substrate 111 and the circuit board 113 may be disposed on the second surface 111B of the substrate 111, but the present disclosure is not limited thereto. The substrate 111 may include a transparent material or an inorganic material, or it may include a hard material or a flexible material, such as glass, quartz, sapphire, ceramic or plastic, or any suitable material. A "flexible material" herein means a material which may be curved, bent, fold, rolled, flexible, stretch, and/or other similar deformation to represent at least one of the above possible deformations. The "flexibility" is not limited to the above-mentioned deformation methods, either. The size of the substrate 111 is not limited, and in some embodiments, the thickness of the substrate 111 may be in a range from 0.2 mm to 2 mm, for example, but the present disclosure is not limited thereto.

In the present disclosure, the electronic component 112 of the electronic panel 110 may include a passive component and an active component, such as a capacitor, a resistor, an inductor, a diode, and a transistor, etc. A diode may include a light-emitting diode or a photoelectric diode. A light emitting diode may include, for example, an organic light emitting diode (OLED), a sub-millimeter light emitting diode, a micro light emitting diode, or a quantum dot light emitting diode, but the present disclosure is not limited thereto. The electronic panel 110 may further include various components for use in the electronic device, such as a dielectric layer (not shown), a metal layer (not shown), such as a metal wire, a metal line and/or a metal trace, a re-distribution layer (not shown), an array of electronic components (not shown), laser marks for alignment (not shown), etc., but the present disclosure is not limited thereto. When the electronic device 100 is applied as a display device, the electronic panel 110 may further include a switching element and/or a driving element (not shown), a common electrode (not shown in the figure), etc., but not limited to the above.

In the present disclosure, the circuit board 113 of the electronic panel 110 and the electronic components 112 may be electrically connected to each other. For example, the circuit board 113 may be electrically connected to the electronic component 112 on the first surface 111A of the substrate 111 by a metal line (not shown) or by a metal trace (not shown) which are disposed on the first surface 111A of the substrate 111, and the circuit board 113 and the electronic component 112 may also be electrically connected to each other by a metal trace on the side surfaces of the substrate 111, but the present disclosure is not limited thereto. For example, FIG. 1 shows two circuit boards 113 respectively disposed on opposite sides of the second surface 111B of the substrate 111, and the circuit boards 113 and the substrate 111 may be generally perpendicular to each other, i.e., the angle between the two is generally 90 degrees, but the present disclosure is not limited thereto.

In the present disclosure, the supporting plate 120 may be provided under the electronic panel 110, for example, the supporting plate 120 may be arranged to face the circuit board 113 or the second surface 111B of the substrate 111. In some embodiments, the second surface 122 and the first surface 121 are respectively two relatively opposite sides of the supporting plate 120, and for example, the second surface 122 is an outer surface farther away from the second surface 111B of the substrate 111 than the first surface 121. The supporting plate 120 may also include an opening 123 for the circuit board 113 to pass through. In some embodiments, the opening 123 of the supporting plate 120 may be provided to correspond to the positions of the circuit boards 113 such that the opening 123 through which the circuit boards pass. FIG. 1 shows an example of the supporting plate 120 including two openings 123, each corresponding to a circuit board 113, but the present disclosure is not limited thereto. In some embodiments, the size of the opening 123 of the supporting plate 120 may be arranged to correspond to the size of the circuit boards 113 such that the opening 123 through which the circuit boards pass. In some embodiments, the shapes of the opening 123 of the supporting plate 120 may be arranged correspond to the shapes of the circuit board 113 such that the opening 123 through which the circuit boards pass. The location, size, or shape of the opening 123 of the supporting plate 120, or the location, size, or shape of the circuit board 113, is not limited. In some embodiments, the thickness of the supporting plate 120 may be, for example, 1 mm to 4 mm, but the present disclosure is not limited thereto. In some embodiments, the thickness of the electronic device 100 between the outer surface of the substrate 111 (e.g., the first surface 111A) and the outer surface of the supporting plate 120 (e.g., the second surface 122) may be, for example, 1.2 mm to 4.2 mm, but the present disclosure is not limited thereto.

In some embodiments, the thermal expansion coefficient of the substrate 111 may be close to that of the supporting plate 120. In some embodiments, the thermal expansion coefficient of the substrate 111 and the thermal expansion coefficient of the supporting plate 120 may be generally the same. For example, the difference between the thermal expansion coefficient of the substrate 111 and the thermal expansion coefficient of the supporting plate 120 may be not greater than 4 ppm/° K, for example, may be less than or equal to 4 ppm/° K, but the present disclosure is not limited thereto. In the present disclosure, the supporting plate 120 may include a transparent material or an opaque material, or may include a hard material or an inorganic material, such as glass, or carbon fiber, or any suitable material, but the present disclosure is not limited thereto.

In the present disclosure, the adhesive material 130 may help fix the supporting plate 120 to the electronic panel 110, for example, the adhesive material 130 may help the supporting plate 120 attached to the electronic panel 110, but the present disclosure is not limited thereto. In some embodiments, the first surface 121 of the supporting plate 120 may attach to the second surface 111B of the substrate 111. In some embodiments, the adhesive material 130 may include partial adhesion or full adhesion. In some embodiments, the implementation for partial adhesion may include a re-workable adhesive/removable adhesive, but the present disclosure is not limited thereto. The embodiment illustrated in FIG. 1 shows the partial adhesion of the adhesive material 130, for example, generally on the left side and on right side of the first surface 121, but the present disclosure is not limited thereto. In some embodiments, the full adhesion may include an entire piece of a back adhesive, but the present disclosure is not limited thereto. In some embodiments, the thickness of the adhesive material 130 between the second surface 111B of the substrate 111 and the first surface 121 of the supporting plate 120 may be not greater than 0.2 mm, for example, may be 0.1 mm to 0.2 mm, but the present disclosure is not limited thereto.

Figure 2:
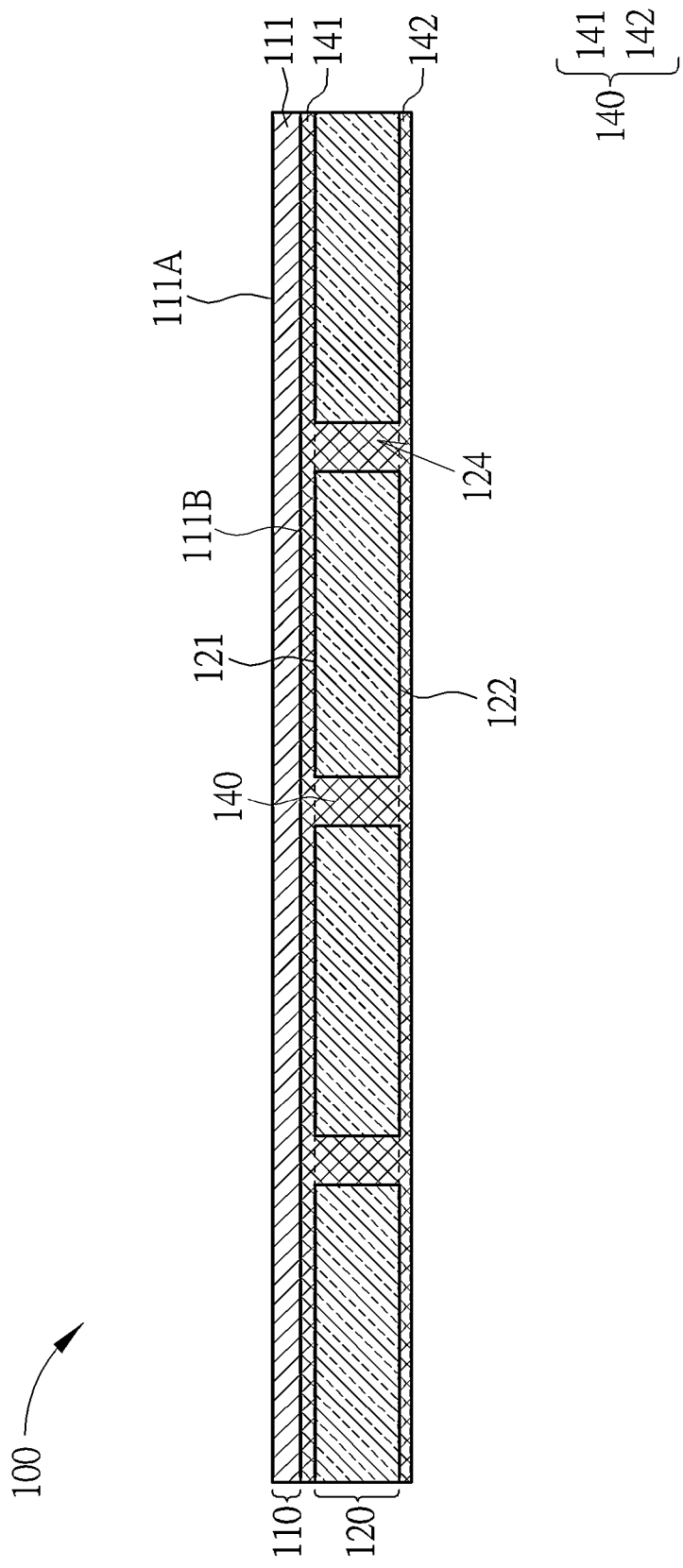
FIG. 2 illustrates a schematic cross-sectional view of the electronic device of an embodiment of the present disclosure.

FIG. 2 illustrates a schematic cross-sectional view of the electronic device 100 of an embodiment of the present disclosure. In some embodiments of the present disclosure, the electronic device 100 may further include a thermal conductive material 140. In some embodiments, the thermal conductive material 140 may be disposed on the surface of the substrate 111, for example, the thermal conductive material 140 may be disposed on the second surface 111B of the substrate 111, but the present disclosure is not limited thereto. In some embodiments, the thermal conductive material 140 may be disposed on the surface of the supporting plate 120, for example, the thermal conductive material 140 may be disposed on the first surface 121 of the supporting plate 120 to become a first thermal conductive film 141, and the first surface 121 of the supporting plate 120 may face the second surface 111B of the substrate 111. In some embodiments, the thermal conductive material 140 may be disposed on the second surface 122 of the supporting plate 120 to become a second thermal conductive film 142.

In some embodiments, the supporting plate 120 may have one or more openings 124. For example, one or more openings 124 may connect the first surface 121 of the supporting plate 120 and the second surface 122 of the supporting plate 120. The thermal conductive material 140 which is filled in at least one hole 124 of the supporting plate 120 may respectively contact the first thermal conductive film 141 and the second thermal conductive film 142, so that the thermal conductive material 140 may be regarded as being disposed between the supporting plates 120. In the present disclosure, the thermal conductivity of the thermal conductive material 140 may be greater than the thermal conductivity of the substrate 111 or greater than the thermal conductivity of the supporting plate 120, which is advantageous for the rapid heat transfer from the electronic components 112 and/or the circuit board 113 to the surface of the electronic device 100, for increasing the heat exchange capability between the first surface 111A and the second surface 111B of the substrate 111, or for increasing the heat exchange capability between the first surface 121 and the second surface 122 of the supporting plate 120, which is advantageous to increase the heat dissipation capacity of the electronic device 100. The thermal conductive material 140 may include, for example, a material of high thermal conductivity, such as copper (Cu) or aluminum (Al), or other materials of higher thermal conductivity than that of the supporting plate 120, but the present disclosure is not limited thereto.

Figure 3:
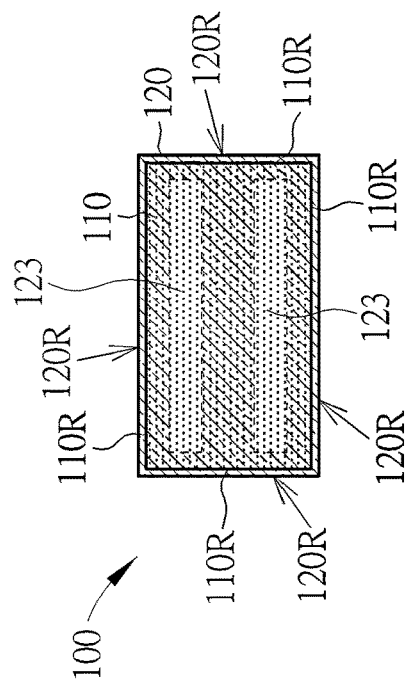
FIG. 3 illustrates a schematic top view of the number of the electronic panels and of the supporting plates of the electronic device of an embodiment of the present disclosure.
Figure 3A:
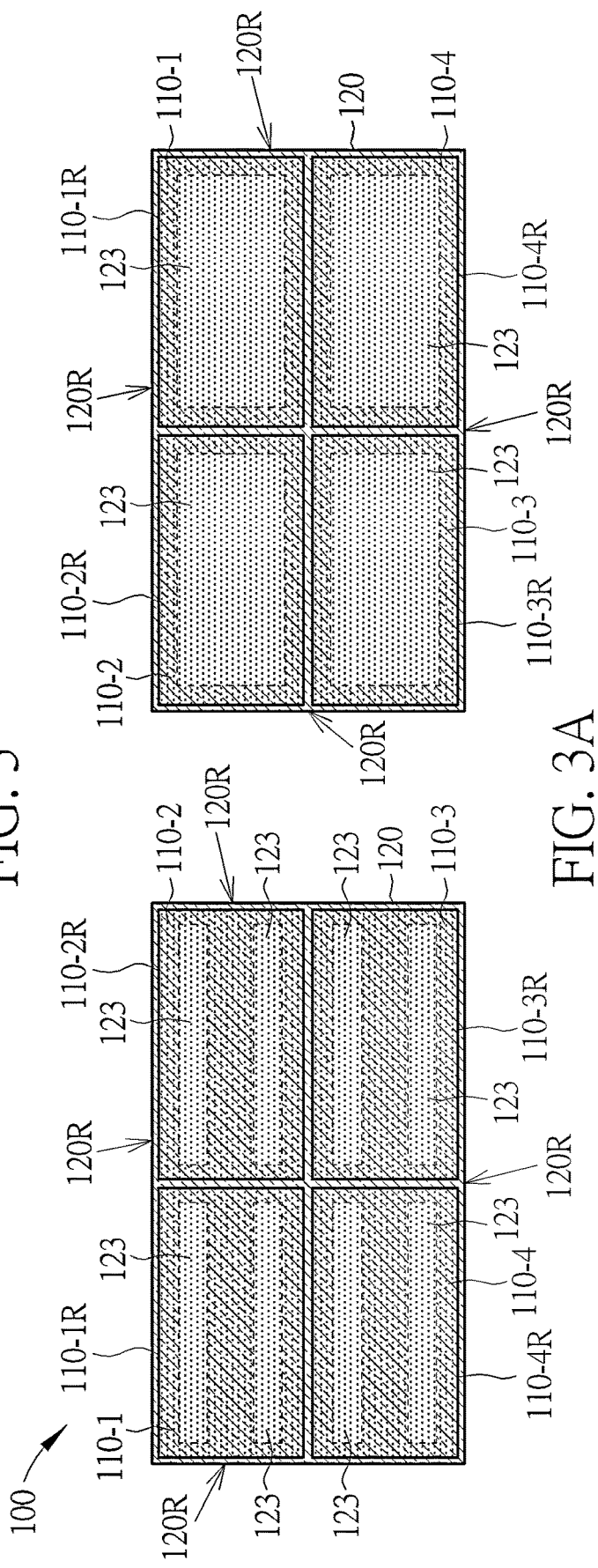
FIG. 3A illustrates a schematic top view of the number of the electronic panels and of the supporting plates of an electronic device of a variant embodiment of the present disclosure.
Figure 3B:
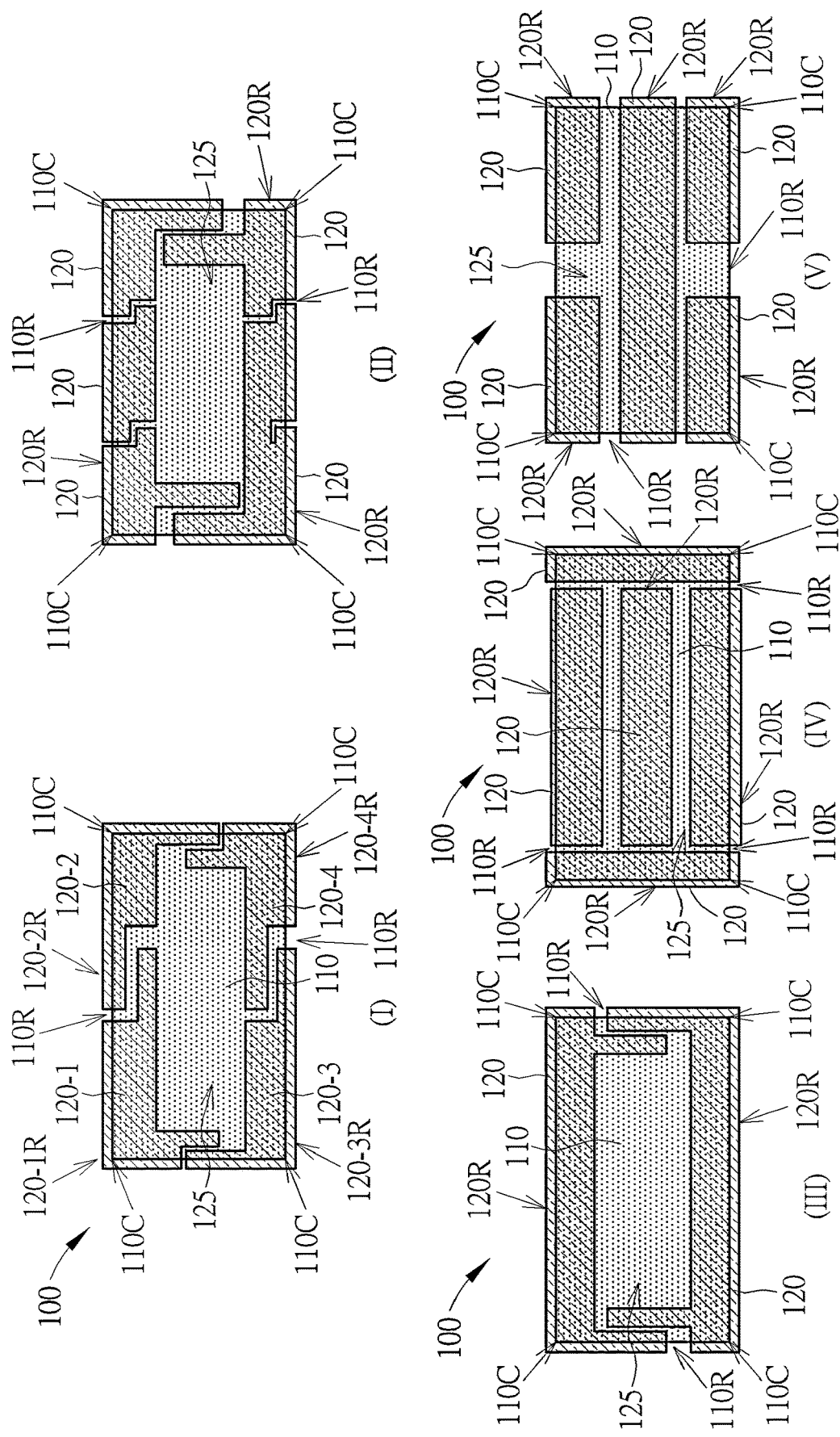
FIG. 3B illustrates a schematic top view of the number of the electronic panels and of the supporting plates of an electronic device of a variant embodiment of the present disclosure.

FIG. 3 illustrates a top view of the number of the electronic panels 110 and of the supporting plates 120 of the electronic device 100 of an embodiment of the present disclosure. FIG. 3A illustrates a top view of the number of the electronic panels 110 and of the supporting plates 120 of an electronic device 100A of a variant embodiment of the present disclosure. FIG. 3B illustrates a top view of the number of the electronic panels 110 and of the supporting plates 120 of an electronic device 100B of a variant embodiment of the present disclosure. In the present disclosure, the number of the electronic panels 110 and the number of the supporting plates 120 in the electronic device 100, in the electronic device 100A or in the electronic device 100B may optionally have different implementations.

In some embodiments, as illustrated in FIG. 1 or in FIG. 3, the number of electronic panels 110 may be equal to the number of supporting plates 120, i.e., one electronic panel 110 is arranged to correspond to one supporting plate 120. In some embodiments, the edge 120R of the supporting plate 120 may extend outwardly from the edge 110R of the electronic panel 110, or the edge 110R of the electronic panel 110 may retract inwardly from the edge 120R of the supporting plate 120 such that the edge 110R of the electronic panel 110 is surrounded and encircled by the edge 120R of the supporting plate 120, and there may be a space or a distance between the edge 110R and the edge 120R. The edge 110R of the electronic panel 110 to be surrounded and encircled by the continuous edge 120R of the supporting plate 120 facilitates the edge 120R of the supporting plate 120 to protect the edge 110R of the electronic panel 110 within, so the chance of the damage to the edge 110R of the electronic panel 110 and of the collateral damage to electronic components (not shown) may be reduced.

In some embodiments, as illustrated in FIG. 3A, the number of electronic panels 110 may be greater than the number of supporting plates 120, or it may be considered that the size of electronic panels 110 may be smaller than the size of supporting plates 120, so that multiple electronic panel 110-1, electronic panel 110-2, electronic panel 110-3 and electronic panels 110-4 correspond to one supporting plate 120 at the same time, and the edge 120R of the supporting plate 120 surrounds multiple edge 110-1R of the electronic panel 110-1, edge 110-2R of the electronic panel 110-2, edge 110-3R of the electronic panel 110-3 and edge 110-4R of the electronic panel 110-4 to facilitate the edge 120R of the supporting plate 120 to protect the edge 110-1R of the electronic panel 110-1, the edge 110-2R of the electronic panel 110-2, the edge 110-3R of the electronic panel 110-3 and the edge 110-4R of the electronic panel 110-4 within, so the chance of the damage to the edge 110-1R of electronic panel 110-1, the edge 110-2R of electronic panel 110-2, the edge 110-3R of electronic panel 110-3 and the edge 110-4R of electronic panel 110-4 and of the collateral damage to electronic components (not shown) may be reduced.

In some embodiments, there may be no physical contact among the multiple edge 110-1R of the electronic panel 110-1, edge 110-2R of the electronic panel 110-2, edge 110-3R of the electronic panel 110-3 and edge 110-4R of the electronic panel 110-4 to form a visually seamless tiled device. In some embodiments, there may be physical contact among the multiple edge 110-1R of the electronic panel 110-1, edge 110-2R of the electronic panel 110-2, edge 110-3R of the electronic panel 110-3 and edge 110-4R of the electronic panel 110-4 to form a physically seamless tiled device. The left side of FIG. 3A illustrates a top view of one supporting plate 120 corresponding to four electronic panels 110-1, 110-2, 110-3 and 110-4, and one supporting plate 120 includes two narrow openings 123; the right side of FIG. 3A illustrates a top view of one supporting plate 120 corresponding to four electronic panels 110-1, 110-2, 110-3 and 110-4, and one supporting plate 120 includes a larger opening 123 whose shape may generally corresponds to the electronic panel 110-1, to the electronic panel 110-2, to the electronic panel 110-3 or to the electronic panel 110-4, but the present disclosure is not limited thereto.

In some embodiments, as illustrated in FIG. 3B, the number of the electronic panels 110 may be less than the number of the supporting plates, or the size of the electronic panels 110 may be smaller than the size of the supporting plates, so that multiple supporting plates are arranged to correspond to one electronic panel 110 at the same time. FIG. 3B illustrates that the shapes of the supporting plates may be irregular rectangles of various types, but the present disclosure is not limited thereto. As illustrated in the example (I) of FIG. 3B, the location of multiple supporting plate 120-1, supporting plate 120-2, supporting plate 120-3 and supporting plate 120-4 may protect the four corners 110C of electronic panel 110 by extending outwardly from the four corners 110C of electronic panel 110. The edge 120-1R of the supporting plate 120-1, the edge 120-2R of the supporting plate 120-2, the edge 120-3R of the supporting plate 120-3 and the edge 120-4R of the supporting plate 120-4 may discontinuously surround the edge 110R of the electronic panel 110 and the four corners 110C to facilitate the protection of the four corners 110C and of the edge 110R of the electronic panel 110 within by a plurality of the edge 120-1R of supporting plate 120-1, the edge 120-2R of supporting plate 120-2, the edge 120-3R of supporting plate 120-3 and the edge 120-4R of supporting plate 120-4, so the chance of the damage to the edge 110R of the electronic panel 110 and to the four corners 110C and of the collateral damage to electronic components (not shown) may be reduced.

The supporting plate 120-1, the supporting plate 120-2, the supporting plate 120-3 and the supporting plate 120-4 located at the four corners 110C of the electronic panel 110 may approximately form an accommodating space 125 for the circuit board 113 of the electronic panel 110 to pass through. FIG. 3B illustrates an embodiment in which one electronic panel may correspond to two to five supporting plates, but the present disclosure is not limited thereto. Example (II) of FIG. 3B illustrates a single electronic panel 110 corresponding to five supporting plates 120, wherein three supporting plates 120 correspond to the upper part of the electronic panel 110 and two supporting plates 120 correspond to the lower part of the electronic panel 110, and the five supporting plates 120 may respectively have different shapes. Example (III) of FIG. 3B illustrates a single electronic panel 110 corresponding to two supporting plates 120, wherein one supporting plate 120 corresponds to the upper part of electronic panel 110 and one supporting plate 120 corresponds to the lower part of electronic panel 110, and the two supporting plates 120 may have mirror-symmetrical shapes. Example (IV) of FIG. 3B illustrates a single electronic panel 110 corresponding to five supporting plates 120, wherein three supporting plates 120 correspond to the upper part and to the lower part of the electronic panel 110, two supporting plates 120 correspond to the left side and to the right side of the electronic panel 110, and the five supporting plates 120 may respectively have different shapes. Example (V) of FIG. 3B illustrates a single electronic panel 110 corresponding to five supporting plates 120, wherein four supporting plates 120 correspond to the corners 110C of the electronic panel 110, one supporting plates 120 corresponds to the center of the electronic panel 110, and the five supporting plates 120 may respectively have different shapes.

Figure 4:
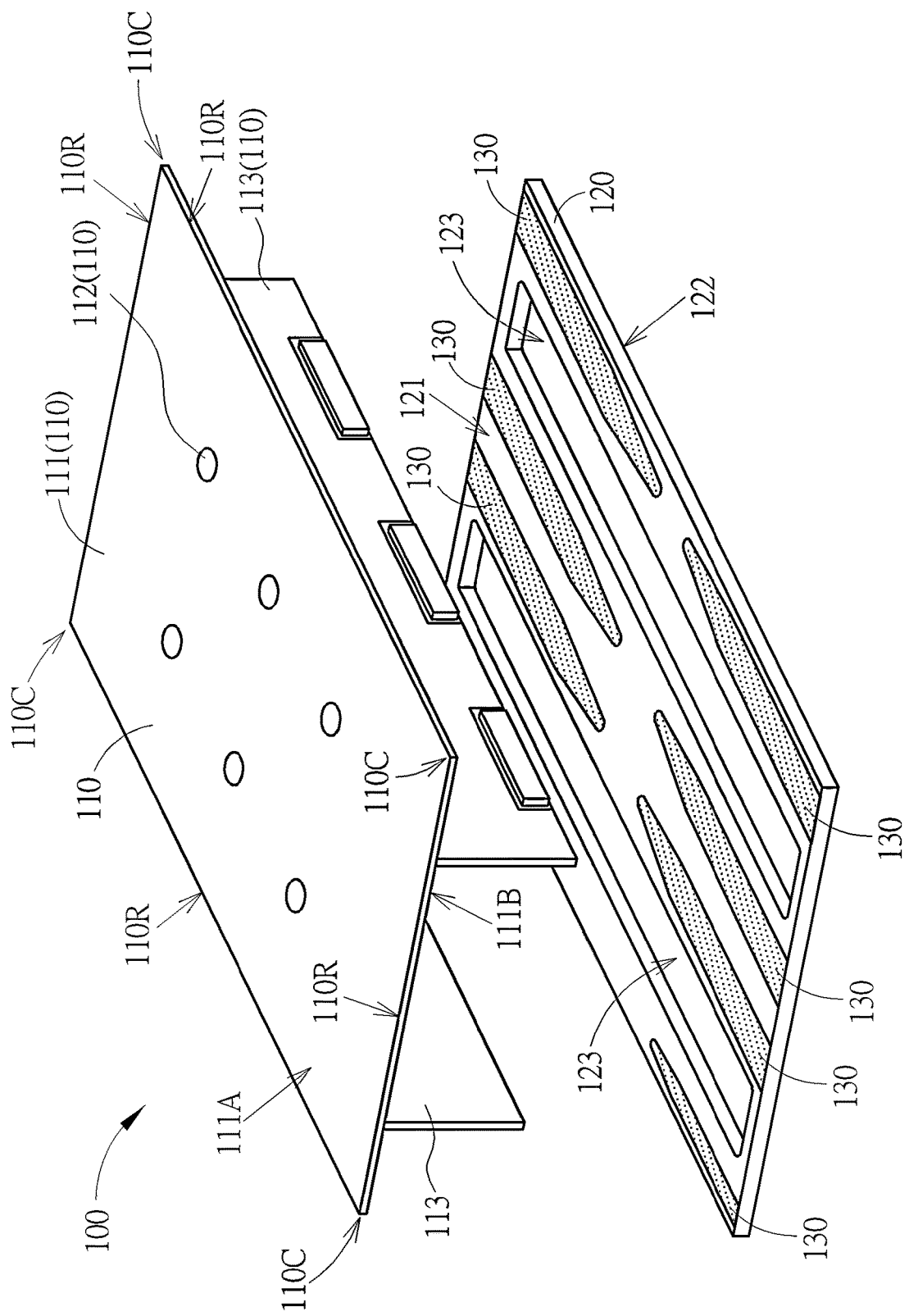
FIG. 4 illustrates a schematic structure of the electronic device of a variant embodiment of the present disclosure.
Figure 4A:
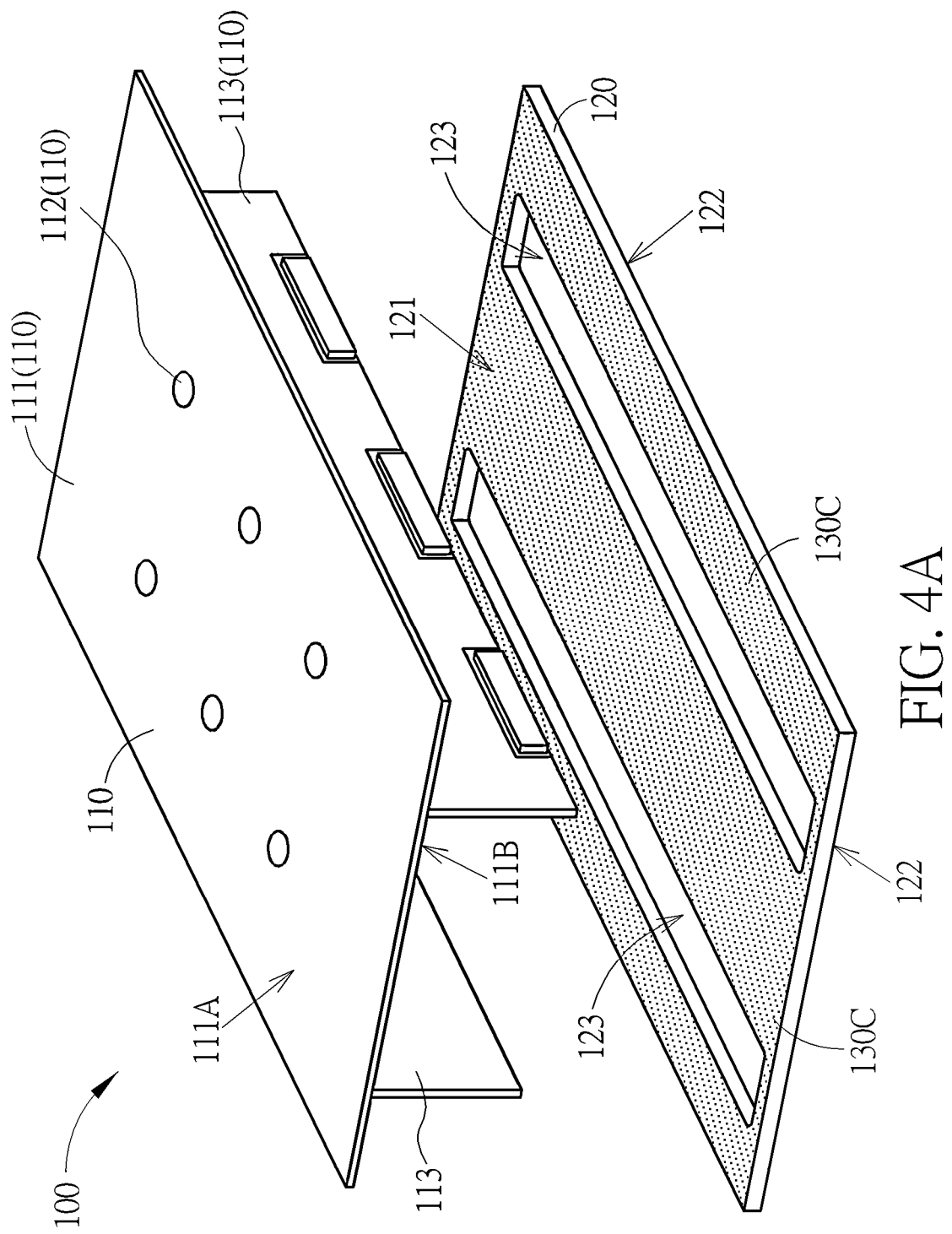
FIG. 4A illustrates a schematic structure of the electronic device of a variant embodiment of the present disclosure.

The following describes various embodiments of the arrangements of the adhesive material in the electronic devices of the present disclosure. FIG. 4 illustrates a schematic structure of the electronic device 100C of a variant embodiment of the present disclosure, to disclose the arrangements of the adhesive material 130. FIG. 4A illustrates a schematic structure of the electronic device 100C of a variant embodiment of the present disclosure, to disclose the arrangements of the adhesive material 130. In some embodiments, as illustrated in FIG. 4, the adhesive material 130 may include a local adhesion, such as multiple locally-arranged release adhesives or multiple pull adhesives on the first surface 121, or multiple release adhesives or multiple pull adhesives arranged at least correspondingly close to the four corners 110C of the electronic panel 110. Optionally, the locally-arranged adhesive material 130 may also be additionally added to correspond to the edge 110R of the electronic panel 110, which helps increase the stability of the supporting plate 120 attached to the substrate 111, or helps the electronic device 100 for rework. In some embodiments, as illustrated in FIG. 4A, the adhesive material 130C may include an entire piece of the adhesive layer, which may be, for example, an entire piece of back adhesive applied on the supporting plate 120. The entire piece of back adhesive also helps increase the stability of the overall attachment of the substrate 111 to the supporting plate 120.

Figure 4B:
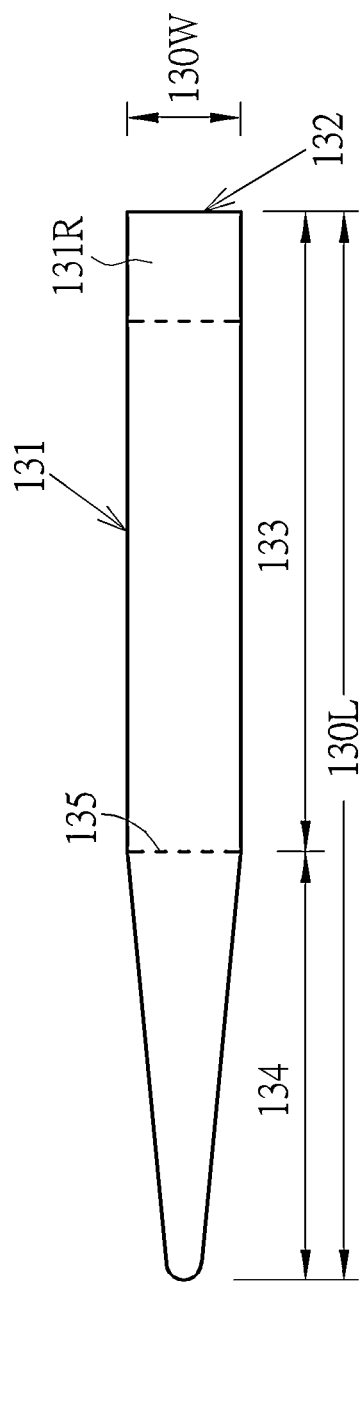
FIG. 4B illustrates a schematic top view corresponding to an embodiment of the adhesive material in the electronic device.

FIG. 4B illustrates a schematic top view corresponding to an embodiment in FIG. 4 of the adhesive material 130 in the electronic device 100 to disclose the shapes of the adhesive material 130 for implementation. When the adhesive material 130 includes a local adhesive layer, for example, a locally arranged release adhesive or a pull adhesive, the substrate 111 may be locally attached to the supporting plate 120 with the help of the locally arranged release adhesive or the pull adhesive. From the top view, the adhesive material 130 may have a designed shape of a variable width, but the present disclosure is not limited thereto. In some embodiments, the adhesive material 130 may be in a form of a long strip with a long side 131 and with a short side 132 adjacent to the long side 131. The maximum distance along the extension direction of the long side 131 (i.e., the direction D1) is defined as the length 130L of the adhesive material 130, and the maximum distance along the extension direction of the short side 132 (i.e., the direction D2) is defined as the width 130W of the adhesive material 130. In some embodiments, the adhesive material 130 may have a variable width.

The adhesive material 130 may include some parts, such as a first region 133 and a second region 134 which are defined by the extension direction of the long side 131, wherein there is a junction region 135 disposed between the first region 133 and the second region 134. The adhesive material 130 may include two regions, for example, the adhesive material 130 respectively includes the first region 133 and the second region 134, i.e., the first region 133 and the second region 134 may respectively correspond to the left region and to the right region of the adhesive material 130. The first region 133 is a region of the adhesive material 130 of a fixed width, and the second region 134 is referred to as a region of the adhesive material 130 with a gradual change in width. The right boundary of the second region 134 in FIG. 4B is the junction region 135 and the width of the adhesive material 130 on the right side of the junction region 135 along the direction D2 is approximately the same, and the width of the adhesive material 130 on the left side of the junction region 135 along the direction D2 gradually decreases to the left, so the second region 134 may be regarded as a region of a gradual change in width and the junction region 135 is referred to as the place where the width of the adhesive material 130 begins to decrease. In detail, in some embodiments, the length of the first region 133 is approximately the same along the direction D1 and the width is approximately the same along the direction D2, i.e., the first region 133 generally has a rectangular shape, but the present disclosure is not limited thereto. The second region 134 includes a width tapered end arranged in the second region 134, such as an end of the second region 134 disposed away from the first region 133. In some embodiments, the length of the second region 134 along the direction D1 is variable and the width of the second region 134 along the direction D2 is variable, for example the width of the second region 134 further away from the first region 133 may gradually and continuously be smaller and smaller, but the present disclosure is not limited thereto. The decreasing width of the second region 134 helps reduce the chance of leaving a residual adhesive on the supporting plate 120 or on the electronic panel 110 when the adhesive material 130 is removed. The junction region 135 may be disposed between the first region 133 and the second region 134 to form a gradually changing junction region where the width along the extension direction of the short side 132 begins to change.

The first region 133 may include a tear-off region 131R. The tear-off region 131R may be disposed at a release end of the first region 133 of the adhesive material 130, such as at an end of the first region 133 away from the second region 134. The tear-off region 131R helps reduce the chance of leaving a residual adhesive on the supporting plate 120 or on the electronic panel 110 when the adhesive material 130 is removed, so it is easy to tear off and/or to rework the adhesive material.

When the adhesive material 130 is a pull adhesive, the length of the pull adhesive may have a suitable aspect ratio to the width of the pull adhesive if it is needed to reduce the chance of the break of the pull adhesive when being pulled out at reworking. In some embodiments, the aspect ratio may be greater than or equal to 10, and less than or equal to 14 (for example, 10 aspect ratio 14). The length of the second region 134 (i.e., the gradually changing region) along the extension direction of the long side 131 may have an appropriate gradually changing region ratio to the total length of the pull adhesive. In some embodiments, the appropriate gradually changing region ratio may be greater than or equal to 0.25, and less than or equal to 0.4 (for example, 0.25 gradient area ratio 0.4).

Figure 5:
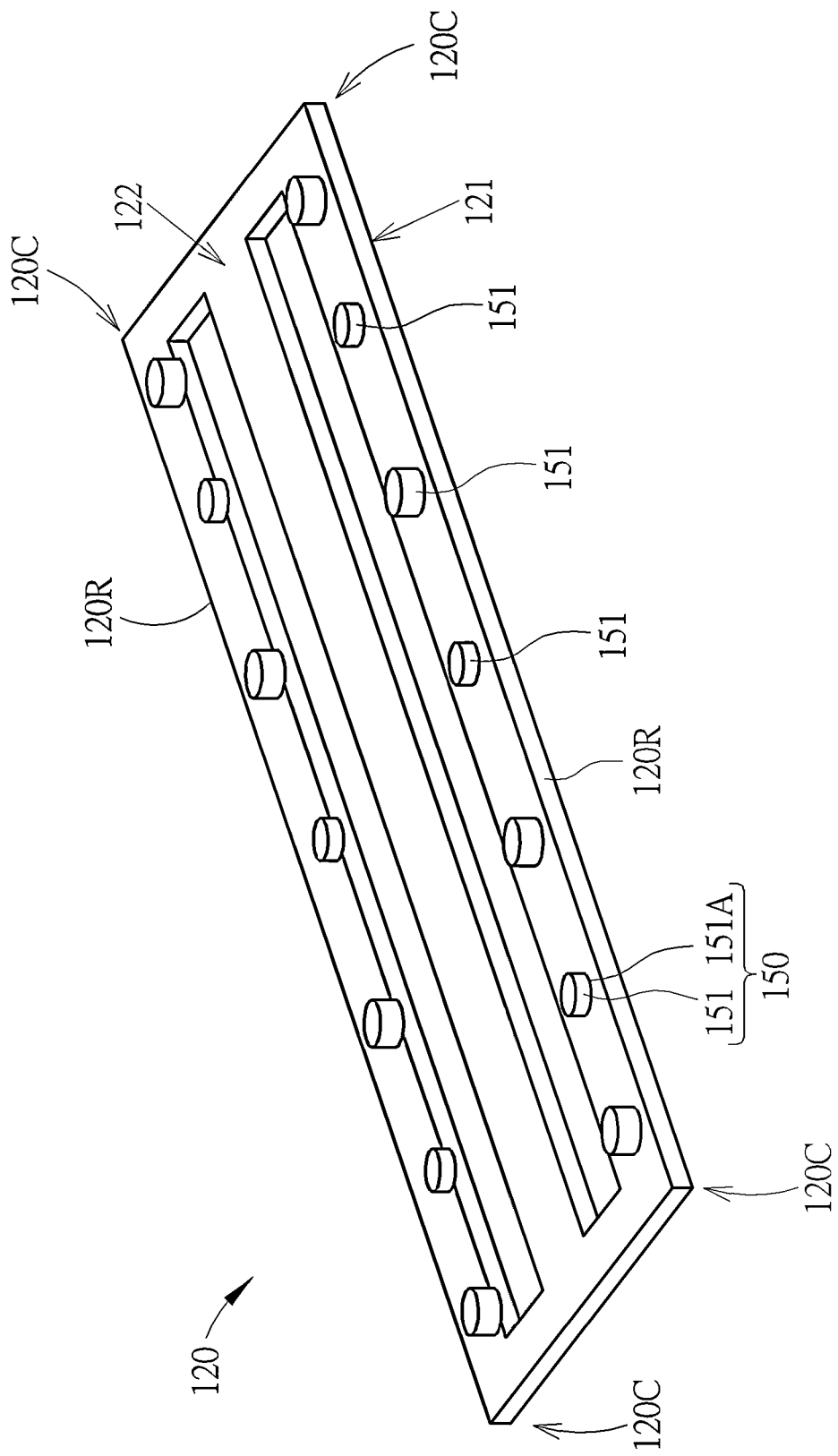
FIG. 5 illustrates a schematic view of the supporting plate of an embodiment of the present disclosure.
Figure 5A:
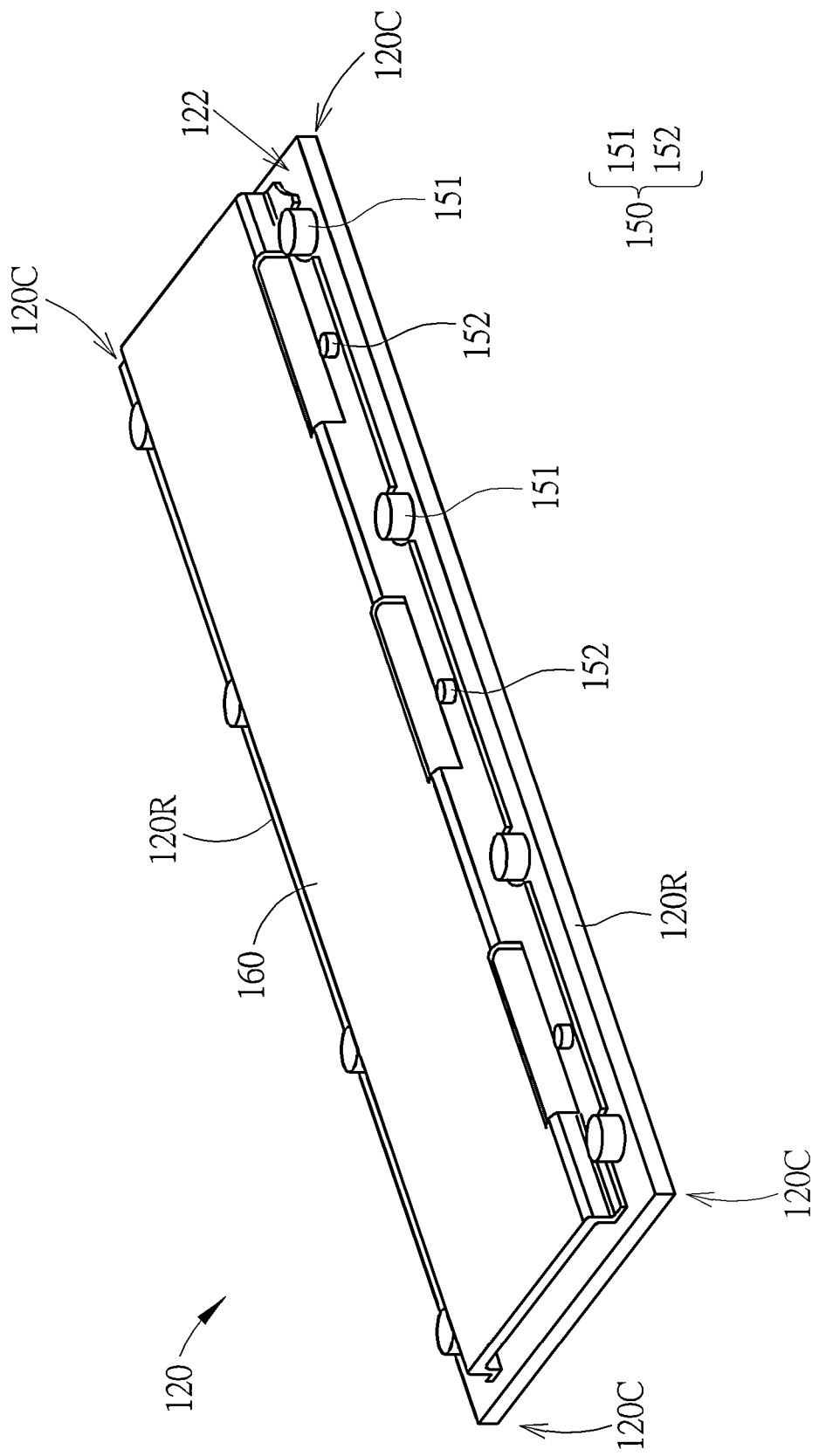
FIG. 5A illustrates a schematic view of the supporting plate of an embodiment of the present disclosure.

The following describes the installations of the fixing members of the supporting plate in the electronic device of the present disclosure. The present disclosure may apply multiple electronic devices to the tiled device, so that fixing members may be provided on the supporting plate to arrange the electronic devices on the brackets of the tiled device by the fixing members. FIG. 5 illustrates a schematic view of the backside of the supporting plate 120 of an embodiment of the present disclosure to indicate the installations of multiple fixing members on the supporting plate 120. FIG. 5A illustrates a schematic structure of the back side of the supporting plate 120 and of the bracket 160 in an embodiment of the present disclosure to show the installations of multiple locking members, magnetic members on the supporting plate 120 and the bracket 160. As illustrated in FIG. 5 or FIG. 5A, in some embodiments, if the material of the supporting plate 120 itself is not suitable for the direct attachment of the fixing members, additional fixing members 150 may be provided on the supporting plate 120, for example, the additional fixing members 150 may be provided on the second surface 122 of the supporting plate 120, which helps increase the stability of fixing the supporting plate 120 to the tiled device 10 (as shown in FIG. 6).

The additional multiple fixing members 150 may be provided in the vicinity of at least four corners 120C of the supporting plate 120. Optionally, the locally provided fixing members 150 may also be additionally provided near the edges 120R of the supporting plate 120, which helps increase the stability of attaching the supporting plate 120 to the substrate 111. In some embodiments, the fixing members 150 may include a stud 151, a structural adhesive 151A, or the fixing members 150 may further include a stud 152, but the present disclosure is not limited thereto. In some embodiments, as illustrated in FIG. 5A, the stud 151 of the fixing member 150 may be glued to the second surface 122 of the supporting plate 120 by means of the structural adhesive 151A in order to lock or magnetically attach the supporting plate 120 to the tiled device 10 (as shown in FIG. 6), but the present disclosure is not limited thereto. Alternatively, in some embodiments, as illustrated in FIG. 5A, on one hand, the locking stud 152 may secure the support 160 of the supporting plate 120 to the second surface 122 of the supporting plate 120, or on the other hand, the magnetically sensitive stud 151 may magnetically attach the electronic device 100 to the fixing members (not shown) corresponding to the supporting bracket (not shown) of the tiled device (not shown), but the present disclosure is not limited thereto.

Figure 6:
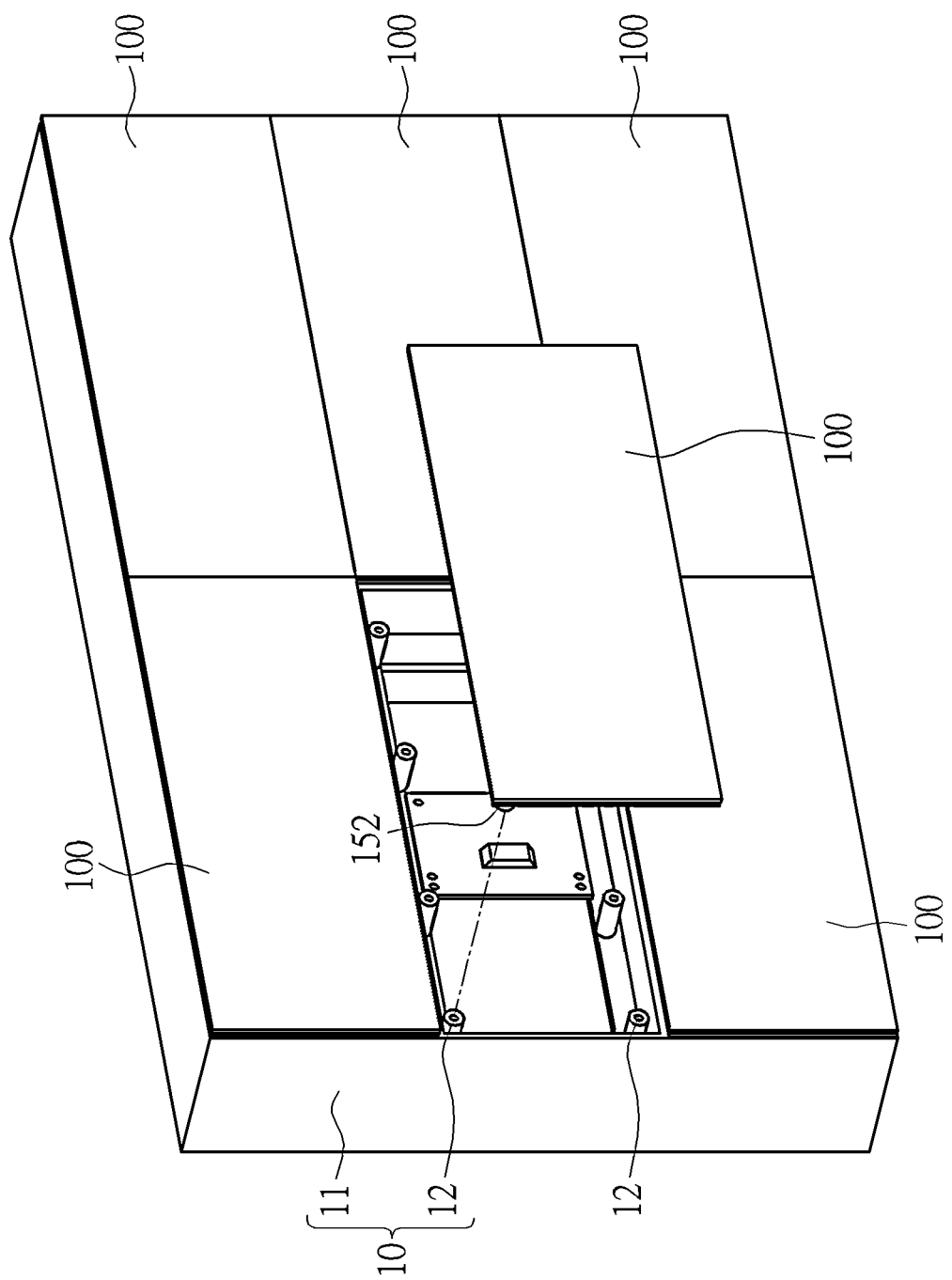
FIG. 6 illustrates a schematic structure of a plurality of electronic devices arranged in an array to form a tiled device in an embodiment of the present disclosure.

FIG. 6 illustrates a schematic structure of a plurality of electronic devices 100 arranged in an array to form a tiled device 10, i.e. a tiled electronic device, in an embodiment of the present disclosure. In some embodiments, the difference between the thermal expansion coefficient of the substrate 111 (shown in FIG. 1) and the thermal expansion coefficient of the supporting plate 120 (shown in FIG. 1) in the electronic device 100 may be less than 4 ppm/° K. (difference <4 ppm/° K.), but the present disclosure is not limited thereto. In some embodiments, the electronic devices 100 satisfying the above conditions may form a tiled device 10. FIG. 6 illustrates six electronic devices 100 arranged in an array to form a tiled device 10, i.e., the tiled device 10 may be, for example, a tiled electronic device which includes a plurality of electronic devices 100, but the present disclosure is not limited thereto.

The tiled device 10 may include a supporting bracket 11, a magnetic fixing member 12 and an electronic device 100. As illustrated in FIG. 5A, the electronic device 100 may include a locking stud 152 and stud 151. For example, the stud 151 may let the electronic device 100 magnetically attached to the magnetic fixing member 12 corresponding to the supporting bracket 11 of the tiled device 10, but the present disclosure is not limited thereto.

Given the above, as shown in FIG. 1 to FIG. 6, if the substrate 111 of the electronic device 100 is made of glass, in order to achieve the strength requirements for transportation and tiling, and/or to reduce the chance of damage to the periphery of the electronic device 100 due to collision and scratch, the supporting plate 120 of a slightly larger size than the electronic panel 110 may be attached to the non-display side (back side) of the electronic panel 110 in an embodiment of the electronic device 100 of the present disclosure. The supporting plate 120 may be made of a material with a thermal expansion coefficient close to that of the substrate 111. In this way, when the supporting plate 120 is glued to the substrate 111 of the electronic panel 110, for example for use as a glass lamp panel, the dimensional expansion value which changes with temperature may be minimized. The smaller difference in expansion value is advantageous to reduce the stress gap between the electronic panel 110 and the supporting plate 120 which are attached together, thus reducing the chance of the electronic device 100 which may warp, damage the adhesive material, fail to adhere, or even cause damage to the electronic components 112.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device comprising:
   at least one electronic panel comprising a substrate, an electronic component disposed on a first surface of the substrate, a circuit board disposed on a second surface of the substrate, the first surface being opposite to the second surface, and the electronic component and the circuit board being electrically connected to each other; and
   at least one supporting plate arranged under the electronic panel and comprising an opening through which the circuit board passes, wherein a difference of a thermal expansion coefficient between the substrate and the at least one supporting plate is less than or equal to 4 ppm/° K.

2. The electronic device according to claim 1, wherein a first surface of the at least one supporting plate is provided with a first thermal conductive film and a second surface of the at least one supporting plate is provided with a second thermal conductive film.

3. The electronic device according to claim 2, wherein the at least one supporting plate has at least one hole which is filled with a thermal conductive material and respectively contacts the first thermal conductive film and the second thermal conductive film.

4. The electronic device according to claim 1, wherein a number of the at least one electronic panel is equal to a number of the at least one supporting plate.

5. The electronic device according to claim 1, wherein a number of the at least one electronic panel is greater than a number of the at least one supporting plate.

6. The electronic device according to claim 1, where a number of the at least one electronic panel is less than a number of the at least one supporting plate.

7. The electronic device according to claim 1, wherein the substrate is partially attached to the at least one supporting plate.

8. The electronic device according to claim 7, wherein the substrate is attached to the at least one supporting plate by a plurality of adhesive materials.

9. The electronic device according to claim 8, wherein the adhesive materials have a length to width ratio in a range of 10 to 14.

10. The electronic device according to claim 8, wherein each of the adhesive materials comprises a first region and a second region, the first region comprises a release end and the second region comprises a width-decreasing end.

11. The electronic device according to claim 1, wherein the substrate is entirely attached to the at least one supporting plate.

12. The electronic device according to claim 1, wherein the at least one supporting plate further comprises a plurality of fixing members disposed on a side of the at least one supporting plate away from the substrate.

13. The electronic device according to claim 1, wherein a material of the substrate comprises glass, and a material of the at least one supporting plate comprises at least one of glass or carbon fiber.

14. The electronic device according to claim 1, wherein the opening is provided to correspond to a position of the circuit board.

15. The electronic device according to claim 1, wherein a size of the opening is arranged to correspond to a size of the circuit board.

16. The electronic device according to claim 1, further comprising:
a locking stud.

17. A tiled electronic device comprising a plurality of electronic devices according to claim 1, wherein the plurality of electronic devices are arranged in an array.

18. The tiled electronic device according to claim 17, wherein a first surface of the at least one supporting plate is provided with a first thermal conductive film and a second surface of the at least one supporting plate is provided with a second thermal conductive film.

19. The tiled electronic device according to claim 17, wherein the at least one supporting plate has at least one hole which is filled with a thermal conductive material and respectively contacts the first thermal conductive film and the second thermal conductive film.

20. The tiled electronic device according to claim 16, comprising a magnetic fixing member.

* * * * *